(12) United States Patent
Le et al.

(10) Patent No.: US 7,076,703 B1
(45) Date of Patent: Jul. 11, 2006

(54) METHOD AND SYSTEM FOR DEFINING A REDUNDANCY WINDOW AROUND A PARTICULAR COLUMN IN A MEMORY ARRAY

(75) Inventors: Binh Quang Le, San Jose, CA (US); Pau-Ling Chen, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 442 days.

(21) Appl. No.: 10/305,700

(22) Filed: Nov. 26, 2002

(51) Int. Cl.
*G11C 29/00* (2006.01)

(52) U.S. Cl. .................................... 714/711
(58) Field of Classification Search ............... 714/710, 714/711, 718, 719, 723; 365/185.09, 200, 365/201
See application file for complete search history.

(56) References Cited

U.S. PATENT DOCUMENTS

| 5,287,310 | A | | 2/1994 | Schreck et al. ........ 365/189.05 |
| 5,502,676 | A | * | 3/1996 | Pelley et al. ................ 365/200 |
| 5,586,075 | A | | 12/1996 | Miwa .................... 365/185.29 |
| 5,748,527 | A | | 5/1998 | Lee et al. .............. 365/185.09 |
| 6,122,194 | A | * | 9/2000 | Chung et al. .......... 365/185.09 |
| 6,381,174 | B1 | | 4/2002 | Roohparvar et al. ... 365/185.09 |

FOREIGN PATENT DOCUMENTS

EP          0933709 A2      8/1999

* cited by examiner

*Primary Examiner*—Albert Decady
*Assistant Examiner*—James Kerveros

(57) ABSTRACT

A method for a memory redundancy, including a memory array typically having a plurality of columns (e.g., bit lines) of memory cells, and identifying a particular (e.g., defective) column of the memory array and further defining a redundancy window by selecting a group of adjacent columns including the defective column. The number of columns in the group of selected columns may be equal to the number of columns in a redundancy array that is coupled to the memory array. The redundancy array is used for storing information that would have been otherwise stored in the memory cells in the redundancy window. The selected group includes at least one column on one side of the defective column and another column on the other side of the defective column. Typically, there will be multiple columns on each side of the defective column.

23 Claims, 14 Drawing Sheets

| A(1:0) | | 00 | | | | | | 01 | | | | | | 10 | | | | | |
|---|---|---|---|---|---|---|---|---|---|---|---|---|---|---|---|---|---|---|---|
| A(6:5) | | 00 | | | | | | 01 | | | | | | 10 | | | | | |
| PHYSICAL | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
| LOGICAL | 0 | 4 | 8 | 12 | 16 | 20 | 24 | 28 | 32 | 36 | 40 | 44 | 48 | 52 | 56 | 60 | 64 | 68 | 72 | 76 | 80 | 84 | 88 | 92 |

(Figure 5 — memory cell / metal-1 column mapping table, patent US 7,076,703 B1)

| 501 | | | | | | | |
|---|---|---|---|---|---|---|---|
| 11 | | | | | | | |
| 24 | 25 | 26 | 27 | 28 | 29 | 30 | 31 |
| 96 | 100 | 104 | 108 | 112 | 116 | 120 | 124 |

| 502 | | | | | | | |
|---|---|---|---|---|---|---|---|
| 11 | | | | | | | |
| 56 | 57 | 58 | 59 | 60 | 61 | 62 | 63 |
| 97 | 101 | 105 | 109 | 113 | 117 | 121 | 125 |

| 503 | | | | | | | |
|---|---|---|---|---|---|---|---|
| 11 | | | | | | | |
| 88 | 89 | 90 | 91 | 92 | 93 | 94 | 95 |
| 98 | 102 | 106 | 110 | 114 | 118 | 122 | 126 |

| 504 | | | | | | | |
|---|---|---|---|---|---|---|---|
| 11 | | | | | | | |
| 120 | 121 | 122 | 123 | 124 | 125 | 126 | 127 |
| 99 | 103 | 107 | 111 | 115 | 119 | 123 | 127 |

From sheet 7/13

Figure 5 continued

METHOD AND SYSTEM FOR DEFINING A REDUNDANCY WINDOW AROUND A PARTICULAR COLUMN IN A MEMORY ARRAY

TECHNICAL FIELD

The present claimed invention generally relates to memory arrays. More specifically, the present claimed invention relates to a memory redundancy scheme.

BACKGROUND ART

The architecture of a typical memory array is known in the art. Generally, a memory array includes a number of lines arranged as rows and columns. The rows of the array are commonly referred to as word lines and the columns as bit lines.

The word lines and bit lines overlap at what can be referred to as nodes. Situated at or near each node is a memory cell, which is generally some type of transistor. In a virtual ground architecture, a bit line can serve as either a source or drain line for the transistor (memory cell), depending on which memory cell is being program verified or read. For simplicity of discussion, a "read" can refer to either a read operation or a program verification operation.

Prior Art FIG. 1 is a representation of a portion of a memory array 5. For simplicity of illustration, only the columns (bit lines) of memory array 5 are shown. Also, only two blocks (Block 0 and Block 1) of memory array 5 are shown; it is understood that there are typically more than two blocks in a conventional memory array. These groups of blocks may be referred to as input/output (I/O) blocks, or simply "I/Os." In general, an I/O includes some number of columns that are coupled (e.g., gated) to a single I/O pad or port. In one type of conventional memory array, there are 32 columns per block or I/O (N=32).

It should be noted that the columns shown by Prior Art FIG. 1 are the "metal-2" bit lines. Associated with each metal-2 bit line are two "metal-1" bit lines. With N=32, for example, there are 64 metal-1 bit lines per I/O, and memory array 5 can store 64 bits of information per word line per I/O. The use of terminology such as metal-1 bit lines and metal-2 bit lines is known in the art.

When reading a selected memory cell, a core voltage is applied to the word line corresponding to that cell, and the bit line corresponding to that cell is connected to a load (e.g., a cascode or cascode amplifier). In a memory array that utilizes a virtual ground architecture, all of the memory cells on the word line are subject to the core voltage. This can induce a leakage, or error, current along the word line, in effect causing an unwanted interaction between the memory cells on the word line. The leakage current, if of sufficient magnitude, may cause an error when reading the selected memory cell.

To minimize the interaction among memory cells on a word line and to reduce errors during reads, a technique commonly referred to as precharging is used. Precharging works by charging (applying an electrical load) to the column next to the column that corresponds to the memory cell being read. If the drain node and the precharge node are at about the same voltage, then the precharge has the effect of reducing the leakage current. Referring to Prior Art FIG. 1, to read a memory cell on column 1, for example, a precharge voltage is applied to column 2.

In the conventional art, memory array 5 may be coupled to a redundancy array (not shown). The redundancy array is essentially another block of memory that has the same number of rows as memory array 5, but fewer columns. The number of columns in the redundancy array is typically less than the number of columns in a block or I/O, although this is not necessarily always the case.

To simplify the discussion of how a redundancy array is employed, an example will be used in which the number of columns in the redundancy array is less than the number of columns in a block. Testing of memory array 5 may indicate that the memory cells along one of the columns in the memory array cannot be properly read. A defect, such as a short to ground, may have been introduced into the column during manufacturing, for example. The redundancy array is used as a replacement for the defective column as well as the other columns in the block that contains the defective column. The columns in memory array 5 that are replaced using the redundancy array may be referred to as the "redundancy window." A redundancy window 6 is exemplified in Prior Art FIG. 1. According to the present example, redundancy window 6 is fixed in position and includes some number of columns less than the number of columns in Block 1. Instead of writing data to and reading data from the columns in redundancy window 6, the data are written to and read from the redundancy array. Thus, the memory cells in redundancy window 6 are not programmed.

The redundancy scheme just described can be problematic after memory array 5 has been repeatedly erased. When a sector of memory is erased, all of the memory cells in the sector are erased. "Y-select" decoding is common for all I/Os; as such, when Block 1 is erased, the memory cells in redundancy window 6 are also erased. Therefore, continuing with the example from above, the memory cells in redundancy window 6 are erased even though these memory cells have not been programmed. As a result, the memory cells in redundancy window 6 can become "over-erased." With over-erasing, the resistance of the memory cells in redundancy window 6 is decreased, thereby increasing the leakage (error) current for those cells. This in turn can effect the reading of memory cells in the columns adjacent to redundancy window 6, in particular the memory cells immediately adjacent to redundancy window 6 (e.g., those memory cells in column N−1). For instance, the leakage current associated with column N may be large; when the precharge is applied to column N, it may not be large enough to compensate for the leakage current, which may cause an error when reading column N−1.

Accordingly, a redundancy scheme that eliminates or reduces errors when reading memory cells adjacent to the redundancy window would be an improvement over conventional redundancy schemes.

DISCLOSURE OF THE INVENTION

Embodiments of the present invention pertain to a method of memory redundancy, and a system thereof, that can reduce or eliminate errors when reading memory cells adjacent to the redundancy window in a memory array. A particular column (e.g., a defective column) of the memory array is identified. According to the various embodiments of the present invention, the redundancy window is defined by selecting a group of adjacent columns including the defective column. The group of columns is selected such that there is at least one column on one side of the defective column and another column on the other side of the defective column. Typically, there will be multiple columns on each side of the defective column. In one embodiment, the redundancy window is defined such that the defective column is approximately in the middle of the group of adjacent columns. In another embodiment, the redundancy window is defined by specifying an address corresponding to a boundary of the redundancy window.

In one embodiment, only the memory cells in the columns at the boundaries of the redundancy window are programmed. In another embodiment, the memory cells in all of the columns in the redundancy window, on both sides of the defective column, are programmed. Generally speaking, according to the various embodiments of the present invention, a barrier of functioning and programmed columns is situated between the defective column and the columns adjacent to (outside of) the redundancy window.

In one embodiment, the plurality of columns in the memory array is organized into separate input/output (I/O) groups, wherein columns within an I/O group are coupled to a respective I/O pad. In such an embodiment, the redundancy window can include columns from two adjacent I/O groups. For one such embodiment, a method is described for directing data in the redundancy array to the proper I/O pad. Also described is a method for determining whether or not a specified address results in a hit in the redundancy window (and therefore in the redundancy array).

BRIEF DESCRIPTION OF THE DRAWINGS

The accompanying drawings, which are incorporated in and form a part of this specification, illustrate embodiments of the invention and, together with the description, serve to explain the principles of the invention:

PRIOR ART

FIG. 5 illustrates a bitmap (physical and logical) an exemplary input/output block of a memory array according to one embodiment of the present invention.

BEST MODES FOR CARRYING OUT THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "identifying" or "defining" or "programming" or "specifying" or "selecting" or "establishing" or "receiving" or "determining" or "comparing" or "reading" or the like, refer to the action and processes of a computer system (e.g., flowcharts 600, 700, 730 and 800 of FIGS. 6, 7A, 7B and 8A, respectively), or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
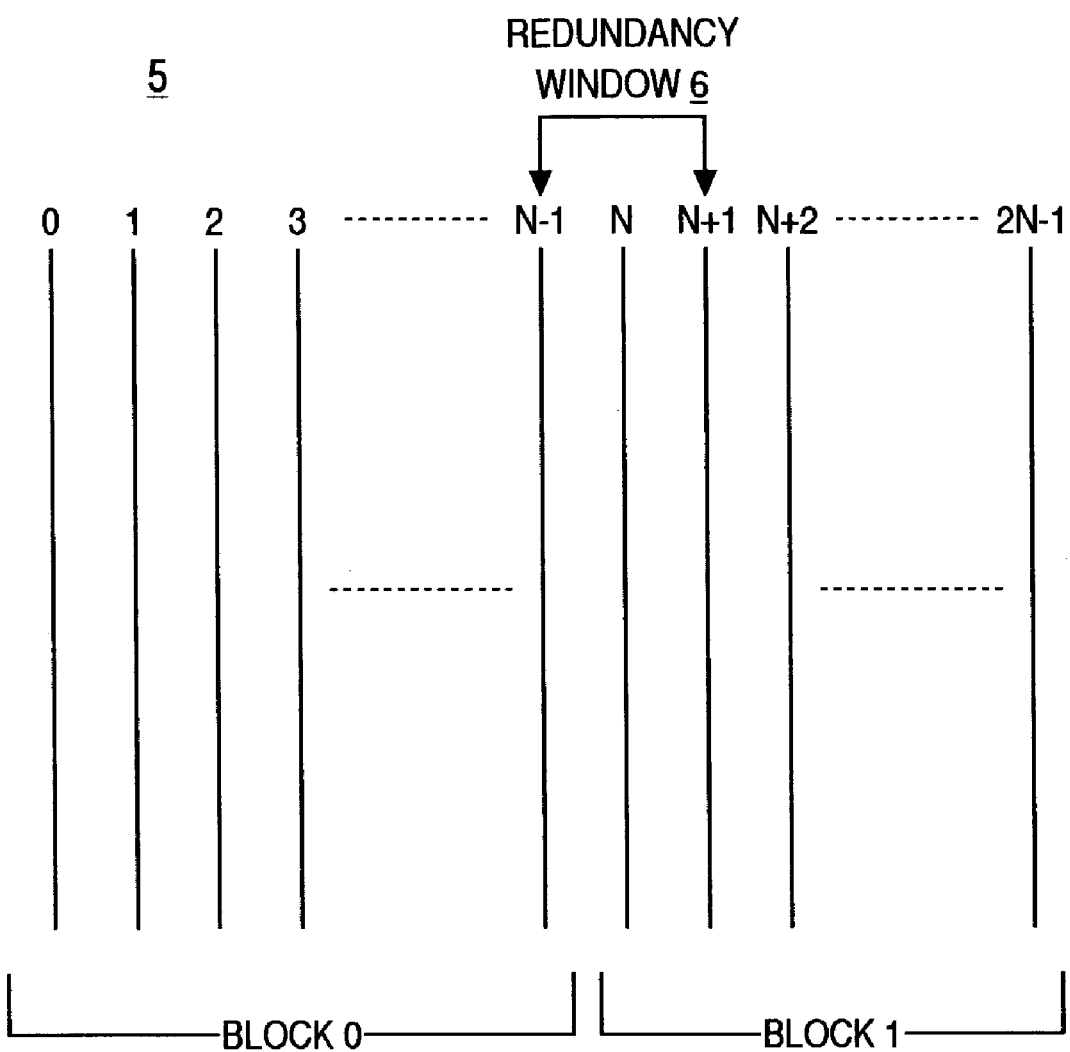
FIG. 1 is a representation of a portion of a memory array showing a prior art memory redundancy scheme.
Figure 2A:
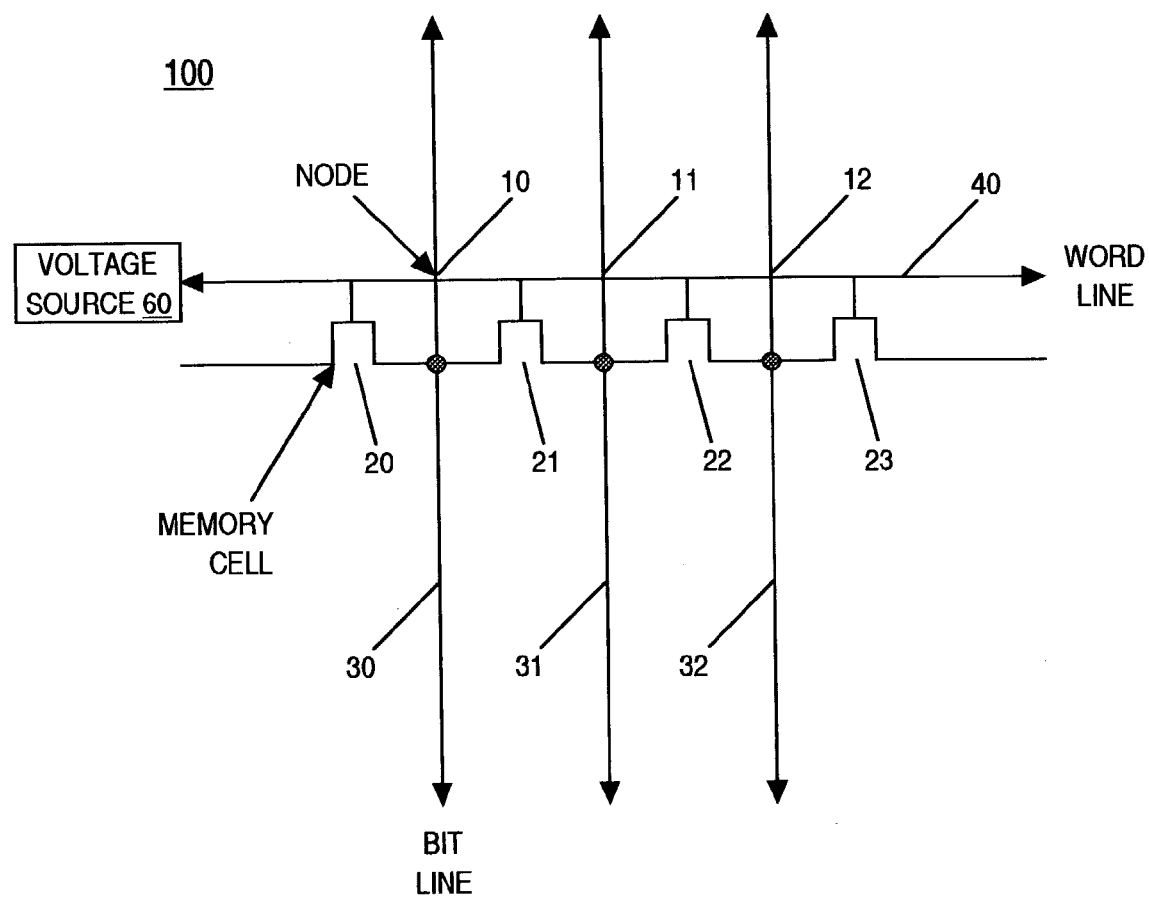
FIG. 2A is a representation of a memory array upon which embodiments of the present invention may be practiced.

FIG. 2A is a representation of a portion of a memory array 100 according to one embodiment of the present invention. In FIG. 2A, for simplicity of discussion and illustration, a single word line 40 and a number of bit lines 30, 31 and 32 are illustrated. However, it is understood that a memory array may actually utilize a different number of word lines and bit lines. That is, memory array 100 will in actuality extend further to the left and right and also horizontally and vertically (left, right, horizontal and vertical being relative directions). Word lines may be referred to as rows, and bit lines may be referred to as columns; however, it is understood that those are relative terms. It is also understood that only certain elements of a memory array are illustrated; that is, a memory array may actually include elements other than those shown. For example, in one embodiment, memory array 100 utilizes a virtual ground architecture. In a virtual ground architecture, a bit line can serve as either a source or drain, depending on the memory cell being read (or program verified).

Couplable to word line 40 is a power supply (voltage source 60), while couplable to each bit line 30–32 is a load (not shown). The bit lines 30–32 are substantially parallel to each other, and word line 40 is substantially orthogonal to the bit lines. The word line 40 and the bit lines 30–32 overlap (but are not connected) at a number of nodes 10, 11 and 12, respectively. Corresponding to each of these nodes is a memory cell 20, 21 and 22. That is, in this embodiment, memory cell 20 corresponds to node 10, memory cell 21 corresponds to node 11, and memory cell 22 corresponds to node 12. Also illustrated is a memory cell 23, corresponding to another node (not shown). The memory cells 20–23 are actually between bit lines and "under" the word lines ("under" being a relative term). The memory cells 20–23 may be a single bit memory cell such as memory cell 200 of FIG. 3A, or a mirror bit memory cell such as memory cell 250 of FIG. 3B.

Figure 2B:
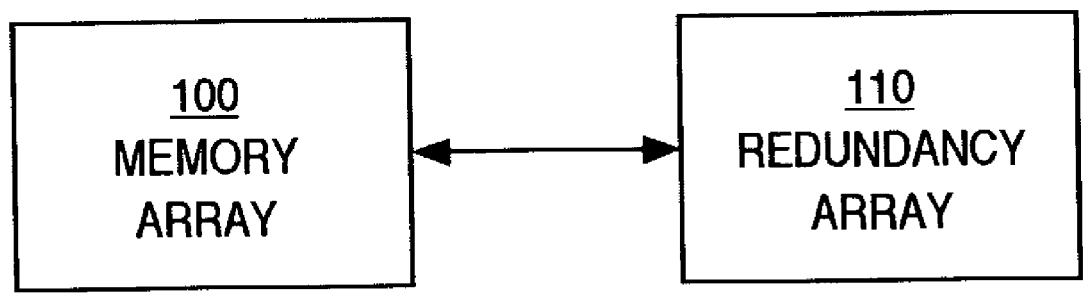
FIG. 2B is a block diagram showing a memory array and a redundancy array according to one embodiment of the present invention.

FIG. 2B is a block diagram showing a memory array 100 coupled to a redundancy array 110 according to one embodiment of the present invention. Although illustrated as separate elements, it is appreciated that memory array 100 and redundancy array 110 may be integrated as a single element. Generally speaking, redundancy array 110 is essentially another block of memory that has the same number of rows as memory array 100, but fewer columns. Redundancy array 110 is used in a redundancy scheme that is described below.

Figure 3A:
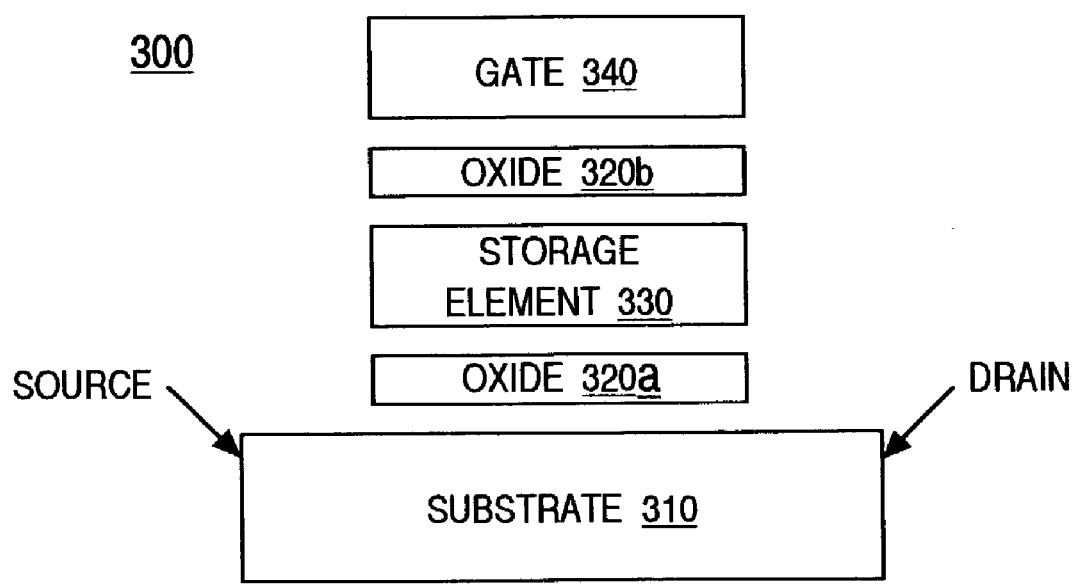
FIG. 3A is a representation of an exemplary memory cell according to one embodiment of the present invention.

FIG. 3A is a representation of an exemplary memory cell 300 according to one embodiment of the present invention. In this embodiment, memory cell 300 is a floating gate memory cell that includes a substrate 310 in which source and drain regions are formed. Typically, memory cell 300 also includes a first oxide layer 320a, a storage element 330 (e.g., a floating gate), a second oxide layer 320b, and a control gate 340. In this embodiment, storage element 330 is used for storing a single bit. Memory cells such as memory cell 300 are known in the art.

Figure 3B:
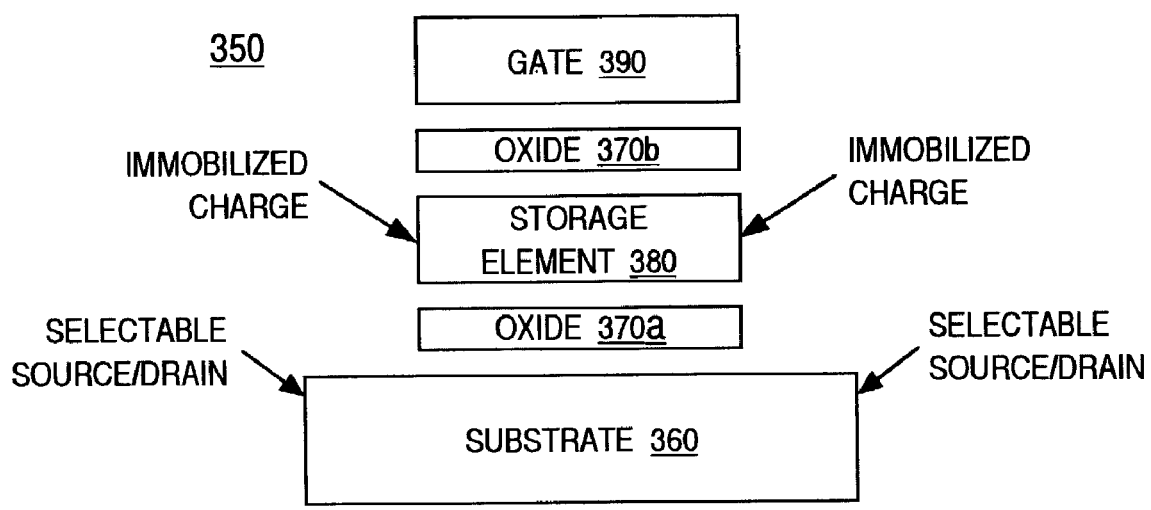
FIG. 3B is a representation of an exemplary mirror bit memory cell according to one embodiment of the present invention.

FIG. 3B is a representation of an exemplary mirror bit memory cell 350 according to one embodiment of the present invention. In this embodiment, memory cell 350 includes a substrate 360, a first oxide layer 370a, a storage element 380 (e.g. a floating gate), a second oxide layer 370b, and a control gate 390. Unlike memory cell 300 of FIG. 3A, which is based on an asymmetric transistor with a distinct source and a distinct drain, memory cell 350 is based on a symmetric transistor with similar (selectable) source and drain. Also, mirror bit memory cell 350 is configured to allow a bit to be stored on either or both sides of storage element 380. Specifically, once electrons are stored on one side of storage element 380, they remain on that side and do not migrate to the other side of the storage element. Thus, in the present embodiment, two bits can be stored per memory cell.

Figure 4:
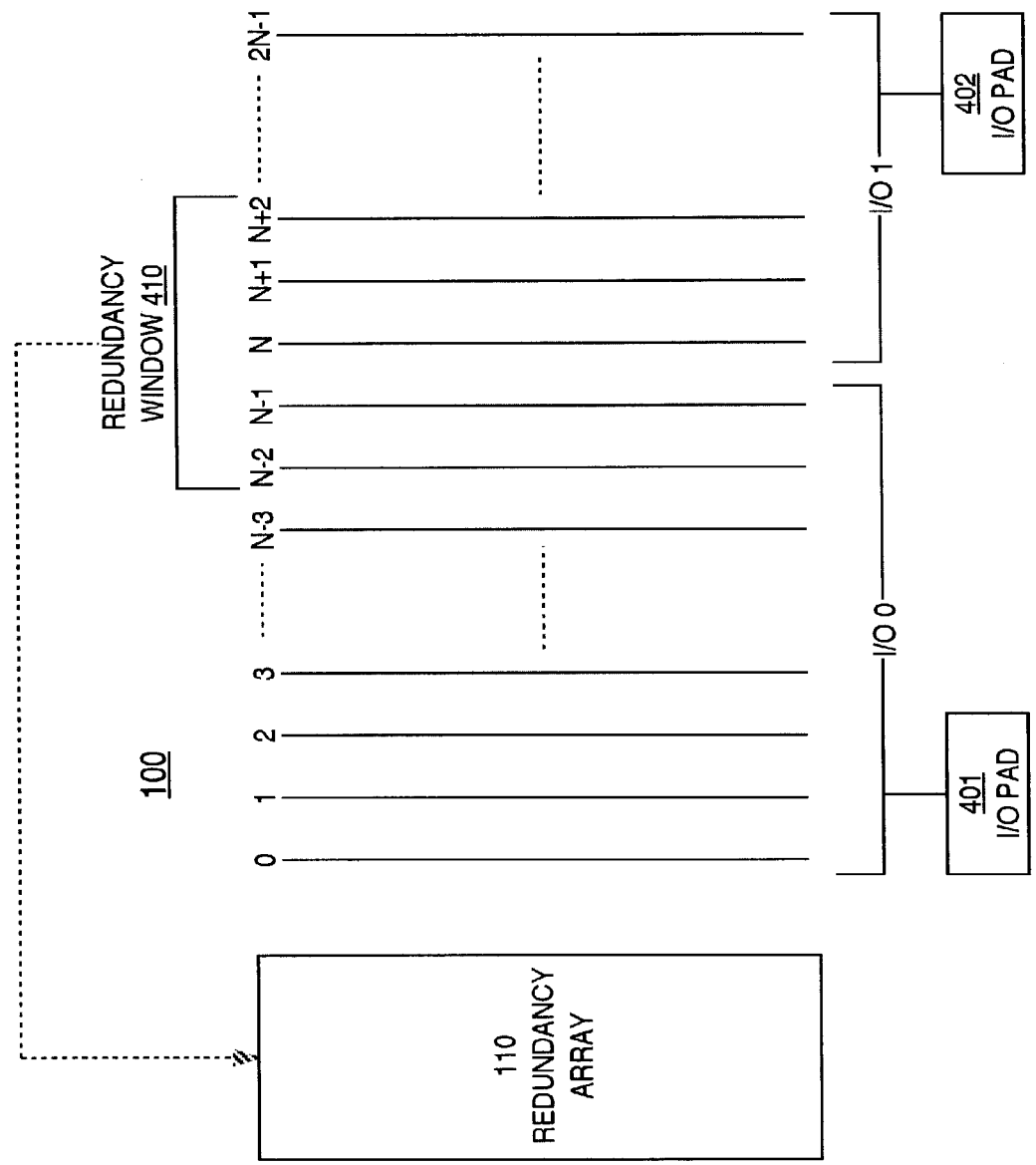
FIG. 4 is a representation of a memory array showing a memory redundancy scheme in accordance with one embodiment of the present invention.

FIG. 4 is a representation of a memory array 100 showing a memory redundancy scheme in accordance with one embodiment of the present invention. For simplicity of illustration, only the columns (bit lines) of memory array 100 are shown. Also, only two input/output (I/O) blocks (I/O 0 and I/O 1) of memory array 100 are shown; however, it is understood that memory array 100 will typically include more than two I/O blocks. In addition, each I/O may be divided into some number of sub-I/Os (refer to FIG. 5).

As used herein, an I/O block or I/O group (or simply "I/O") includes some number of columns that are coupled (e.g., gated) to a single I/O pad or port. In FIG. 4, I/O 0 is coupled to I/O pad 401 and I/O 1 is coupled to I/O pad 402. Each I/O is uniquely identifiable using I/O CAMs (content addressable memories) in a known fashion. For example, for 16 I/Os, four CAMs are used to uniquely identify each I/O.

In one embodiment, there are 32 columns per I/O (N=32). It should be noted that the columns shown by FIG. 4 are the metal-2 bit lines. Associated with each metal-2 bit line are two metal-1 bit lines. With N=32, for example, there are 64 metal-1 bit lines per I/O. In the memory architecture exemplified by FIG. 3A, memory array 100 can store 64 bits of information per word line per I/O. In the memory architecture exemplified by FIG. 3B (the mirror bit architecture), memory array 100 can store 128 bits of information per word line per I/O.

With reference to FIG. 4, memory array 100 is in communication with a redundancy array 110. Redundancy array 110 includes some number of columns. Redundancy array 110 can be organized as having a number of elements, each element including some number of columns. For example, redundancy array 110 may include a single element of five columns, or it may include two elements of five columns each. Redundancy array 110 may include any number of columns organized as any number of elements.

According to the various embodiments of the present invention, a redundancy window 410 is defined by selecting a group of adjacent columns equal to or less than the number of columns in an element of redundancy array 110. For ease of discussion, redundancy array 110 is assumed herein to have a single element of five columns, and as such redundancy window 410 is also described herein as including five columns. However, it is appreciated that redundancy window 410 may include any number of columns, depending on the number of columns in redundancy array 110.

According to the embodiments of the present invention, redundancy window 410 is defined by selecting columns such that there is at least one column on one side of a particular (e.g., defective) column and another column on the other side of the defective column. Typically, redundancy window 410 will include more than one column on each side of the defective column. For instance, a column such as column N may be identified as being defective or faulty (although column N may be selected for some other reason). According to the embodiments of the present invention, redundancy window 410 includes column N and adjacent columns on both sides of column N (e.g., columns N−2 and N−1 on one side, and columns N+1 and N+2 on the other side). In one embodiment, the number of columns selected on one side of the defective column (e.g., column N) is equal to the number of columns selected on the other side of the defective column, such that column N is centered in redundancy window 410. Note that redundancy window may lie entirely within an I/O block, may encompass an entire I/O block, or may include columns from two adjacent I/O blocks. This latter instance is illustrated by FIG. 4.

According to one embodiment of the present invention, redundancy window 410 is defined by specifying an address that corresponds to one of the boundaries of the redundancy window. One scheme is described in conjunction with FIG. 5, below. Other schemes can be used to define the redundancy window. For example, the address corresponding to column N−2 (or column N+2) can be used to identify one boundary of redundancy window 410. Because the number of columns in redundancy window 410 is known, the other columns included in the redundancy window can be determined from the address of column N−2 (or column N+2). As another example, the addresses of each column in redundancy window 410 may be used, or the addresses of the columns at both of the borders of redundancy window 410 may be used. In an embodiment in which the defective column (e.g., column N) lies at the center of redundancy window 410, the address of column N can be used to define the redundancy window, because an equal number of columns will lie to either side of column N.

As mentioned above, according to the embodiments of the present invention, the redundancy window 410 of FIG. 4 is defined such that there is at least one column on each side of the defective column. As such, there will be functioning (non-defective) columns at the boundaries of redundancy window 410. In one embodiment, the memory cells in at least one column on each side of the defective column is programmed. In one such embodiment, only the memory cells in the columns at the boundaries of redundancy window 410 are programmed. In another such embodiment, the memory cells in all of the functional columns in redundancy window 410 are programmed. As such, a barrier of functioning and programmed columns is effectively placed between the defective column and the columns adjacent to (outside of) the redundancy window.

In one embodiment, programming of memory cells in redundancy window 410 is accomplished by writing "0" (zero) into those cells. By programming columns in redundancy window 410, these columns will not experience over-erasing should memory array 100 be repeatedly erased. These columns can therefore be properly precharged during read operations of other, adjacent columns. For example, because column N−2 is programmed even though column N−2 lies within (at the edge of) redundancy window 410, it can be satisfactorily precharged during a read of column N−3, thus eliminating or reducing errors that may occur during reads of memory cells associated with column N−3.

FIG. 5 illustrates a bitmap 500 of a portion of a memory array (e.g., memory array 100 of FIG. 4) according to one embodiment of the present invention. Specifically, bitmap 500 represents one I/O of a mirror bit memory array. In the present embodiment, the I/O of bitmap 500 is organized as four sub-I/Os 501, 502, 503 and 504. Although embodiments of the present invention are subsequently described herein in the context of the mirror bit architecture exemplified by FIG. 3B, it is appreciated that the description can be extended to other memory architectures, such as the architecture exemplified by FIG. 3A.

In the discussion below, one scheme for defining a redundancy window is described. In the scheme to be described, the starting point of the redundancy window is identified; because the number of columns in the redundancy window is known, the redundancy window can be defined from that starting point. As mentioned above, other schemes can be used to define a redundancy window in accordance with the present invention.

In the present embodiment, the I/O represented by bitmap 500 of FIG. 5 has the capability to store 128 bits in 64 memory cells (in 64 metal-1 columns or 32 metal-2 columns). As such, seven addresses (A0 through A6) are needed to identify a specific bit. Each address A0–A6 represents a logical zero or a logical one. Bitmap 500 shows the actual (physical) location of each bit as well as the logical location that is identified using the seven addresses A0–A6.

The number of addresses used to define the starting point of a redundancy window depends on the degree of discreteness that is desired. Should it be desirable to specify the start of the redundancy window at the level of a bit, then seven addresses may be used to define the starting point of the redundancy window. In one embodiment, the starting point of the redundancy window is specified using four addresses, specifically the addresses A6, A5, A1 and A0. As can be seen from FIG. 5, using these four addresses, a particular group of eight bits is identified (however, the eight bits in that group are not individually identifiable using just these four addresses). For example, with A6, A5, A1 and A0 equal to 0, 1, 0, 0, respectively, the group of bits in physical locations 8 through 15 and logical locations 32, 36, 40, 44, 48, 52, 56 and 60 is identified. The starting point ("A") of this redundancy window is thereby identified as including the four columns (eight bits) so identified. Also, the four addresses A6, A5, A1 and A0 can be used to identify a particular position in bitmap 500, identified as "V," that corresponds to the starting point of the group of eight bits.

Depending on the number of columns in the redundancy array, the redundancy window may extend into an adjacent I/O. For example, similar to the manner just described, a redundancy window having a starting point "B" can be identified with A6, A5, A1 and A0 equal to 1, 0, 1, 1, respectively. Should the redundancy window be defined as including 16 columns, the redundancy window having starting point "B" would extend into another (adjacent) I/O, not shown in FIG. 5.

According to the embodiments of the present invention, upon selecting a redundancy window and its starting point, the defined redundancy window is fixed by specifying CAMs that are associated with the redundancy window. These CAMs will be referred to herein as ADDCAMs to distinguish them from the I/O CAMs mentioned above. If the starting point is defined as described above (that is, using four addresses), then four ADDCAMs are used to define the redundancy window; in general, the number of ADDCAMs corresponds to the level of discreteness desired when specifying the redundancy window.

When an application is writing information to or reading information from a memory array, an address in the memory array is typically specified by the application. For simplicity of reference, this address may be referred to herein as the "user-specified address." According to one embodiment of the present invention, the ADDCAMs can be used to determine whether or not the user-specified address results in a hit in the redundancy window (and therefore in the redundancy array). When reading information from the redundancy array, the combination of the user-specified address, the ADDCAMs and the I/O CAMs can be used for directing data in the redundancy array to the proper I/O pad.

Figure 6:
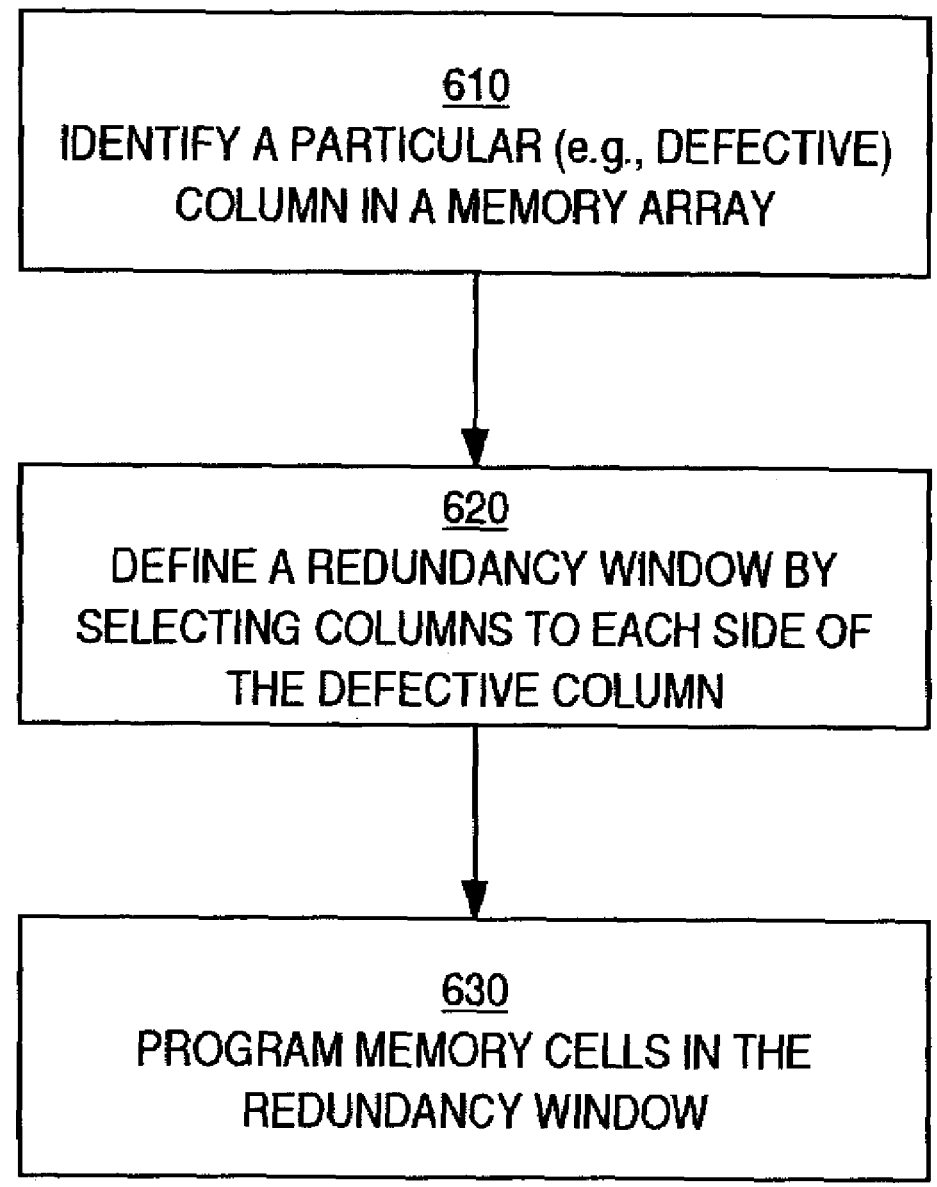
FIG. 6 is a flowchart of a method of memory redundancy according to one embodiment of the present invention.

FIG. 6 is a flowchart 600 of a method of memory redundancy according to one embodiment of the present invention. Although specific steps are disclosed in flowchart 600, such steps are exemplary. That is, the present invention is well suited to performing various other steps or variations of the steps recited in flowchart 600. It is appreciated that the steps in flowchart 600 may be performed in an order different than presented, and that the steps in flowchart 600 are not necessarily performed in the sequence illustrated.

In step 610, in the present embodiment, a particular column in a memory array is identified. For example, a faulty or non-functioning column in the memory array may be identified as the particular column. In the embodiment of FIG. 4, column N is identified as the particular (e.g., defective) column.

In step 620 of FIG. 6, in the present embodiment, a redundancy window is defined by selecting columns (specifically, adjacent columns) on each side of the defective column. In one embodiment, there is at least one column on each side of the defective column; typically, there are more than one column on each side of the defective column. In another embodiment, the defective column is substantially centered in the redundancy window, with the same number of columns on either side of the defective column. In yet another embodiment, the redundancy window includes columns from more than one I/O group or block of columns.

In step 630, in one embodiment, some or all of the memory cells in the redundancy window are programmed. In one such embodiment, at least one column on each side of the defective column is programmed. In another such embodiment, only the columns at the boundaries of the redundancy window are programmed. In yet another embodiment, all of the functional columns in the redundancy window are programmed.

Figure 7A:
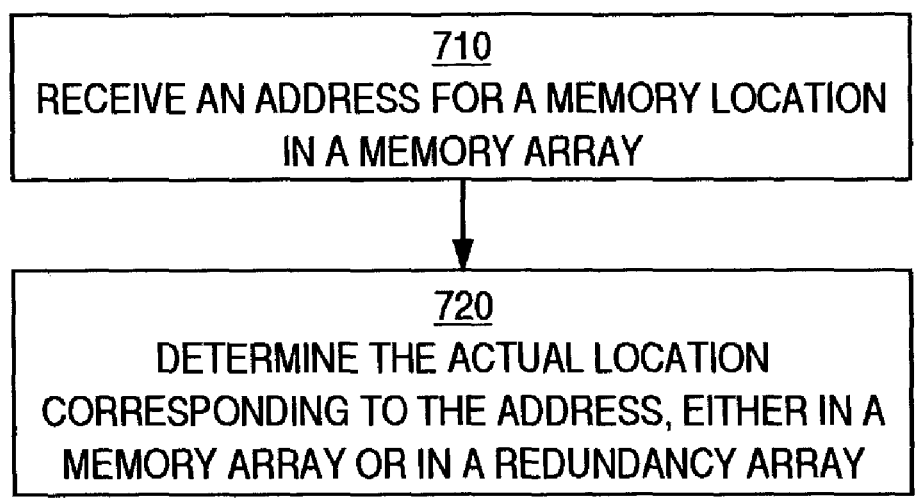
FIG. 7A is a flowchart of a method for determining whether or not an address is associated with a redundancy window according to one embodiment of the present invention.

FIG. 7A is a flowchart 700 of a method for determining whether or not an address is associated with a redundancy window according to one embodiment of the present invention. Although specific steps are disclosed in flowchart 700, such steps are exemplary. That is, the present invention is well suited to performing various other steps or variations of the steps recited in flowchart 700. It is appreciated that the steps in flowchart 700 may be performed in an order different than presented and that the steps in flowchart 700 are not necessarily performed in the sequence illustrated.

In step 710 of FIG. 7A, during a read or write operation, an address (such as a user-specified address specified by an application) is received for a memory location in a memory array. It is important to note that the address will typically point to a location in the memory array. Whether the actual location of the information associated with the address is in either the memory array or the redundancy array is essentially transparent to the operation being performed.

Accordingly, in step 720, the actual memory location that corresponds to the address received in step 710 is determined. As described above, in one embodiment, the redundancy window can be defined using some number of addresses that depends on the level of discreteness desired. In one such embodiment, four addresses referred to as ADDCAMs are used to define the starting point of the redundancy window. In this embodiment, the address received in step 710 can be compared to the ADDCAMs to determine whether or not there is a hit within the redundancy window. A hit within the redundancy window indicates that the actual memory location corresponding to the address is in the redundancy array; otherwise, the actual memory location is in the memory array.

In a read operation, note that the actual memory location of the information corresponding to the address received in step 710 of FIG. 7A can be determined after information is read from the memory array and/or from the redundancy array. This scenario is described further in conjunction with FIG. 7B.

Figure 7B:
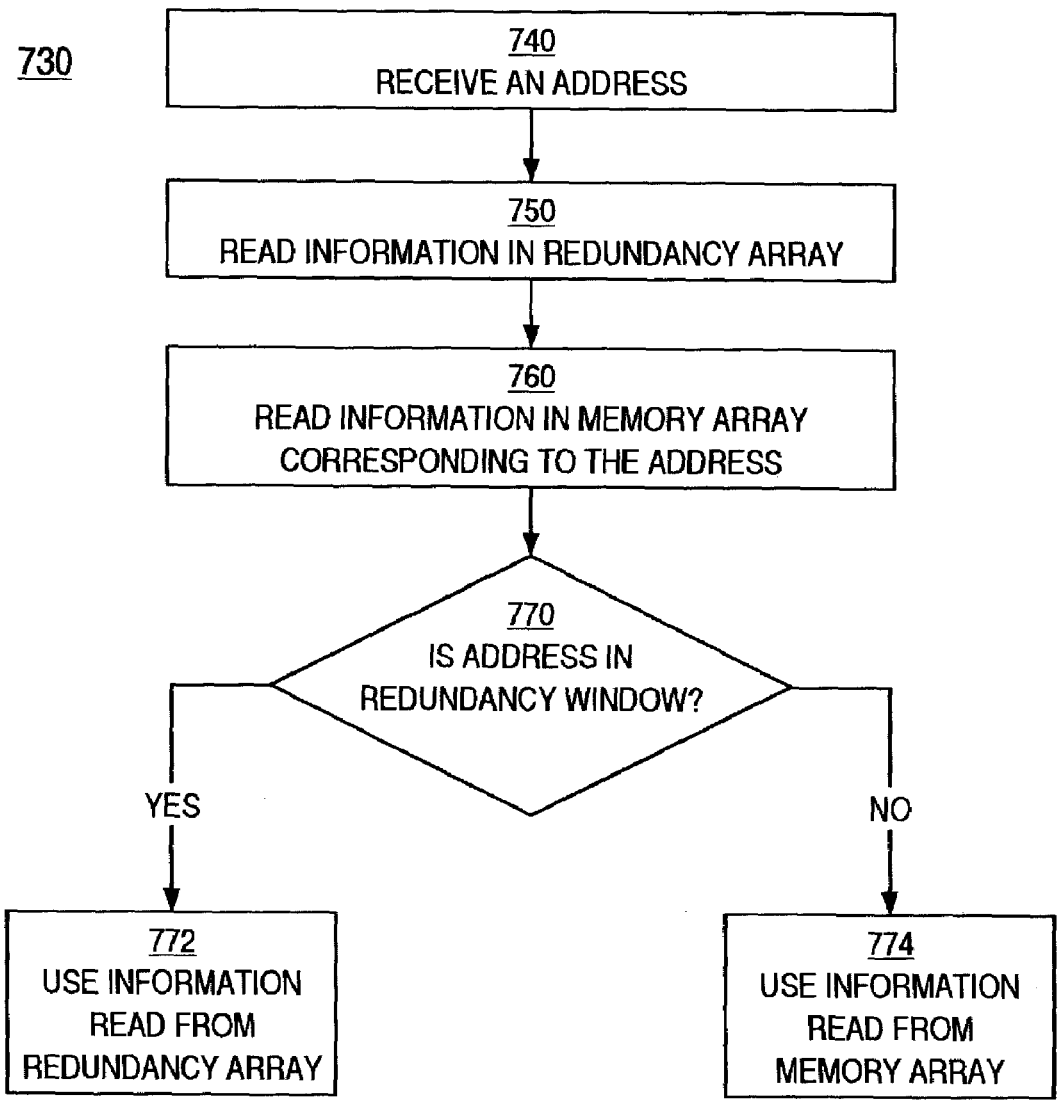
FIG. 7B is a flowchart of a method for reading information from a memory array or redundancy array according to one embodiment of the present invention.

FIG. 7B is a flowchart 730 of a method for reading information from a memory array or redundancy array according to one embodiment of the present invention. With reference to step 740 of FIG. 7B, in the present embodiment, an address is received for a read operation. However, at this point in the process, a determination is not made with regard to whether or not the address corresponds to a location within the redundancy window (and hence with the redundancy array).

In step 750, in the present embodiment, the information in the redundancy array is read. That is, in one embodiment, the information in the redundancy array is always read during a read operation.

In step 760, in the present embodiment, the information at the location in the memory array identified by the address received in step 740 is read. If the location in the memory array corresponds to the column in the array that is defective, no information may be read in step 760. If the location in the memory array corresponds to column within the redundancy window, information may be read; however, the information may or not be valid. For example, as described above, the functioning columns in the redundancy window may be programmed with zeroes only, and perhaps only some of the columns in the redundancy window are programmed. These cases are resolved by step 770, below. Note that steps 750 and 760 can be performed in parallel, at essentially the same time.

In step 770, in the present embodiment,, a determination is made with regard to whether or not the address (from step 740) corresponds to a memory location that is in the redundancy window. If the address corresponds to a memory location in the redundancy window, then the information requested in the read operation is located in the redundancy array. Accordingly, in step 772, the information that was read from the redundancy array in step 750 is used in lieu of the information read from the memory array in step 760. If the address corresponds to a memory location outside of the redundancy window, then the information requested in the read operation is located in the memory array. Accordingly, in step 774, the information that was read from the memory array in step 760 is used in lieu of the information read from the redundancy array in step 750. In one embodiment, steps 772 and 774 are accomplished using a multiplexing operation.

Figure 8A:
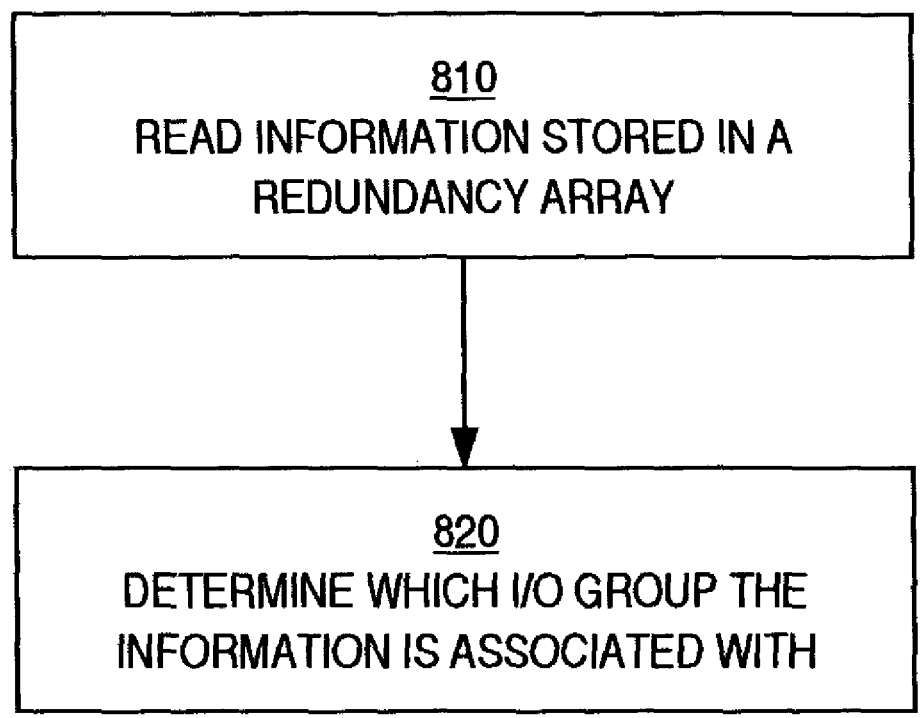
FIG. 8A is a flowchart of a method for determining which input/output pad the redundancy data should be sent to in accordance with one embodiment of the present invention.

FIG. 8A is a flowchart 800 of a method for determining which input/output pad the redundancy data should be sent to in accordance with one embodiment of the present invention. FIG. 8D illustrates one embodiment of a logic circuit for implementing flowchart 800. Although specific steps are disclosed in flowchart 800, such steps are exemplary. That is, the present invention is well suited to performing various other steps or variations of the steps recited in flowchart 800. It is appreciated that the steps in flowchart 800 may be performed in an order different than presented and that the steps in flowchart 800 are not necessarily performed in the sequence illustrated.

In step 810 of FIG. 8A, using processes such as that described in conjunction with FIGS. 7A and 7B above, a memory location in the redundancy array is identified and located in a read operation. As described above, the redundancy window may extend into more than one I/O block. As such, it may be necessary to determine which I/O block is associated with the identified location in the redundancy array, so that information read from that location can be directed to the proper I/O pad or port.

Figure 8B:
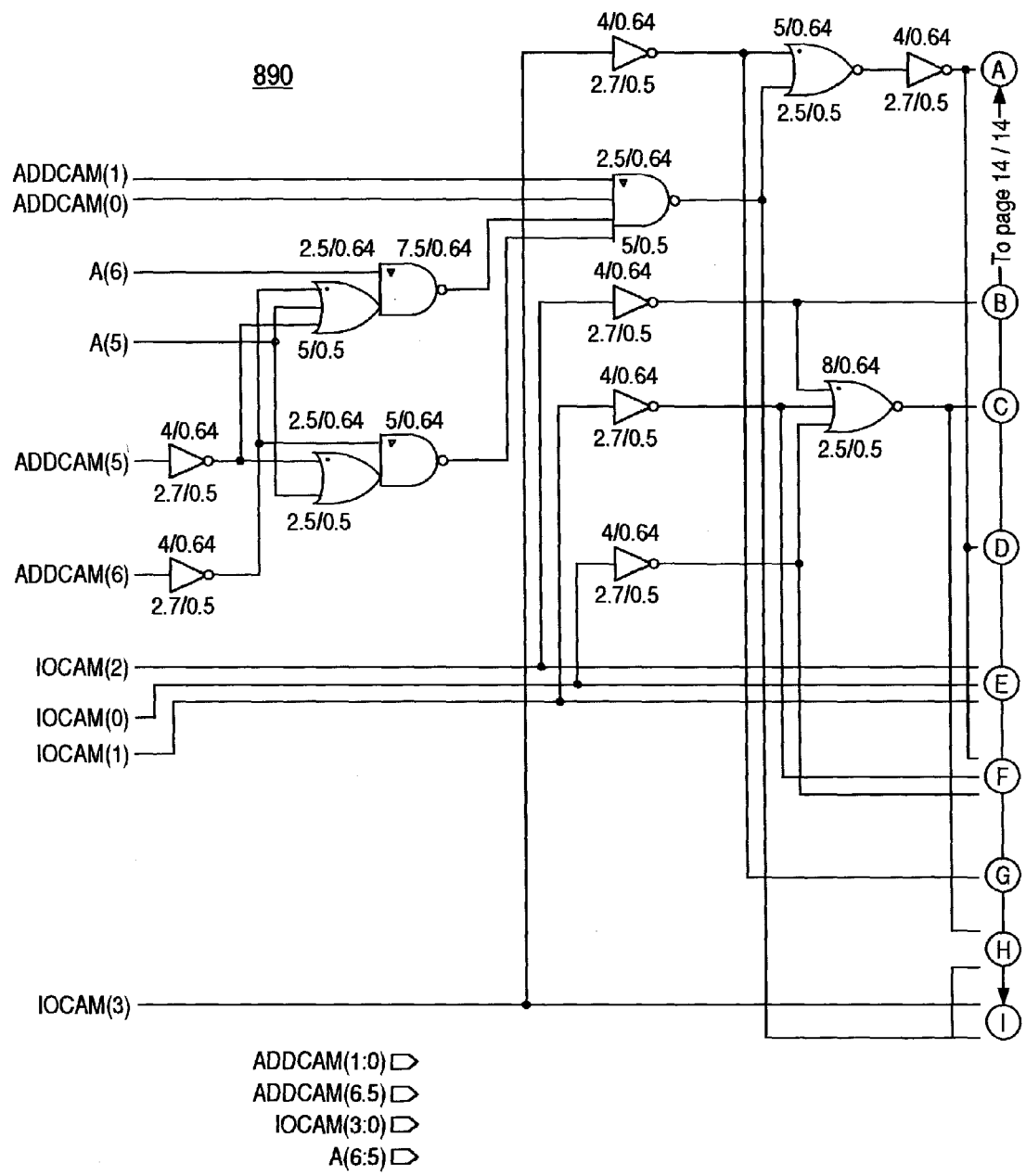
FIG. 8B illustrates a logic circuit for determining which input/output pad the redundancy data should be sent to in accordance with one embodiment of the present invention.
Figure 8B:
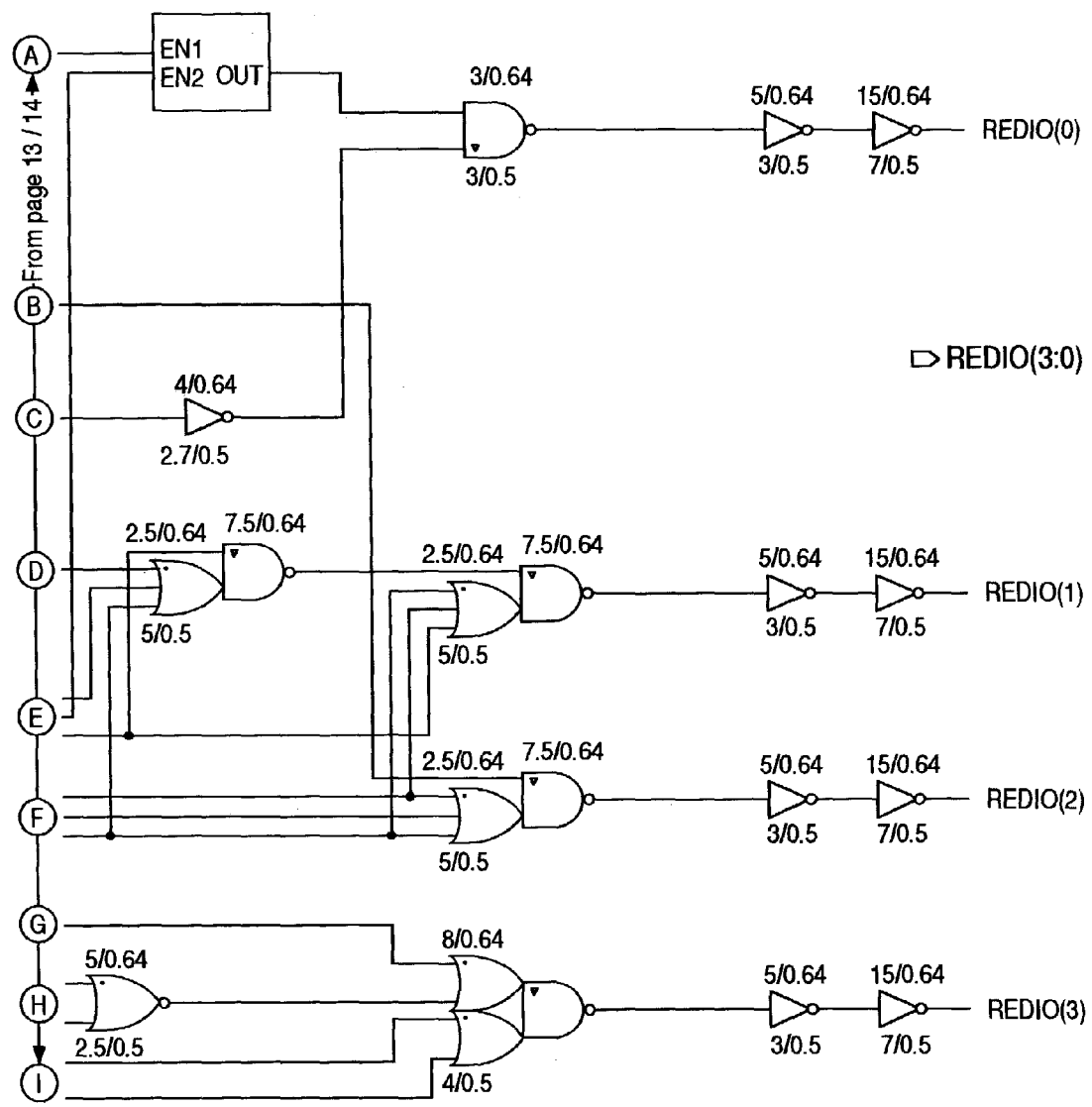

Therefore, in step 820 of FIG. 8A, the appropriate I/O block is determined. In one embodiment, using a logic circuit such as that shown by FIG. 8B, a comparison can be made of the user-specified address, the I/O CAMs that define the various I/O blocks, and the ADDCAMs that define the redundancy window, in order to identify the proper I/O block. Accordingly, the information read from the redundancy array can be directed to the proper I/O pad.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A method of memory redundancy in a memory array, said method comprising:
   identifying a particular column of a memory array, wherein said memory array comprises a plurality of columns of memory cells organized into separate input/output (I/O) groups, wherein columns within an I/O group are coupled to a respective I/O pad;
   defining a redundancy window by selecting a group of adjacent columns including said particular column, wherein said redundancy window comprises columns from two adjacent I/O groups, wherein the number of columns in said group is determined according to the number of columns in a redundancy array that is coupled to said memory array, said redundancy array a replacement for said redundancy window, wherein said group comprises at least a first column on one side of said particular column and a second column on the other side of said particular column; and
   programming memory cells in said first column and memory cells in said second column.

2. The method of claim 1 wherein said memory array utilizes a mirror bit architecture wherein two bits of data are stored in a memory cell.

3. The method of claim 1 wherein said programming comprises:
   programming functional memory cells in said redundancy window.

4. The method of claim 1 wherein said particular column is approximately in the middle of said group of adjacent columns.

5. The method of claim 1 wherein said first column is located at one boundary of said redundancy window and said second column is located at the other boundary of said redundancy window.

6. The method of claim 1 wherein said redundancy window is defined by specifying an address corresponding to a boundary of said redundancy window.

7. A method of memory redundancy in a memory array, said method comprising:
   selecting a particular column of said memory array, wherein said memory array comprises a plurality of columns of memory cells, said plurality of columns organized as separate input/output (I/O) groups wherein columns in an I/O group are coupled to a respective I/O node; and
   establishing a redundancy window by selecting a group of adjacent columns including said particular column, wherein the number of columns in said group of adjacent columns is determined according to the number of columns in a redundancy array that is coupled to said memory array, said redundancy array a replacement for said redundancy window, wherein said group of adjacent columns comprises at least a first column on one side of said particular column and a second column on the other side of said particular column and wherein said group of adjacent columns comprises columns from two adjacent I/O groups.

8. The method of claim 7 further comprising:
   programming memory cells in said first column and memory cells in said second column.

9. The method of claim 8 wherein said programming comprises:
   programming functional memory cells in said group of adjacent columns.

10. The method of claim 7 wherein said memory array utilizes a mirror bit architecture wherein two bits of data are stored in a memory cell.

11. The method of claim 7 wherein said memory array is a virtual ground architecture memory array.

12. The method of claim 7 wherein said particular column is approximately in the middle of said group of adjacent columns.

13. The method of claim 7 wherein said first column is located at one boundary of said redundancy window in a first I/O group and wherein said second is located at the other boundary of said redundancy window in a second I/O group.

14. The method of claim 7 wherein said redundancy window is established using an address that identifies a boundary of said redundancy window.

15. A method of memory redundancy comprising:
   receiving an address for a memory location in a memory array, wherein said memory array comprises a plurality of columns of memory cells, said plurality of columns organized as separate input/output (I/O) groups wherein columns in an I/O group are coupled to a respective I/O node;
   determining an actual memory location corresponding to said address, wherein said actual memory location is either in said memory array or in a redundancy array coupled to said memory array, wherein said redundancy array is a replacement for a redundancy window defined for said memory array, said redundancy window comprising a group of adjacent columns including a particular column of said memory array, wherein said group of adjacent columns comprises at least a first column on one side of said particular column and a second column on the other side of said particular column and wherein said group of adjacent columns comprises columns from two adjacent I/O groups.

16. The method of claim 15 wherein said determining comprises:
   comparing said address to an address that defines a boundary of said redundancy window.

17. The method of claim 15 wherein said memory array utilizes a mirror bit architecture wherein two bits of data are stored in a memory cell.

18. The method of claim 15 wherein said particular column is approximately in the middle of said group of adjacent columns.

19. The method of claim 15 wherein said first column is located at one boundary of said redundancy window in a first I/O group and wherein said second is located at the other boundary of said redundancy window in a second I/O group.

20. The method of claim 15 further comprising:
   reading information in said redundancy array;
   reading information in said memory array at said memory location corresponding to said address; and
   selecting between said information read from said redundancy array and said information read from said memory array according to said actual memory location.

21. A method of memory redundancy comprising:
   reading information stored in a redundancy array coupled to a memory array, wherein said memory array comprises a plurality of columns of memory cells, said plurality of columns organized as separate input/output (I/O) groups wherein columns in an I/O group are coupled to a respective I/O node, wherein said redundancy array is associated with a redundancy window defined for said memory array, said redundancy window comprising a group of adjacent columns including a particular column of said memory array, wherein said group of adjacent columns comprises at least a first column on one side of said particular column and a second column on the other side of said particular column and wherein said group of adjacent columns comprises columns from two adjacent I/O groups, wherein said redundancy array stores information from said two I/O groups; and determining which of said I/O groups said information is associated with.

22. The method of claim 21 wherein said determining comprises:

comparing an address associated with said information to addresses that define boundaries of said I/O groups.

23. The method of claim 21 wherein said memory array utilizes a mirror bit architecture wherein two bits of data are stored in a memory cell.

* * * * *